US007851138B2

(12) United States Patent
Hwang et al.

(10) Patent No.: US 7,851,138 B2
(45) Date of Patent: Dec. 14, 2010

(54) PATTERNING A SURFACE COMPRISING SILICON AND CARBON

(75) Inventors: Cherngye Hwang, San Jose, CA (US); Dennis R. McKean, Milpitas, CA (US); Gary J. Suzuki, San Jose, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 642 days.

(21) Appl. No.: 11/880,157

(22) Filed: Jul. 19, 2007

(65) Prior Publication Data

US 2009/0023100 A1 Jan. 22, 2009

(51) Int. Cl.

| | |
|---|---|
| ***G03F 7/00*** | (2006.01) |
| ***G03F 7/004*** | (2006.01) |
| ***G03F 7/11*** | (2006.01) |
| ***G03F 7/26*** | (2006.01) |
| ***G03F 7/40*** | (2006.01) |

(52) U.S. Cl. .................... 430/317; 430/270.1; 430/311; 430/331; 430/314; 430/322

(58) Field of Classification Search ............. 430/270.1, 430/273.1, 311, 331, 317

See application file for complete search history.

(56) References Cited

U.S. PATENT DOCUMENTS

| | | | | |
|---|---|---|---|---|
| 4,112,213 | A * | 9/1978 | Waldman | 526/279 |
| 4,983,699 | A * | 1/1991 | Dana et al. | 526/240 |
| 5,091,290 | A | 2/1992 | Rolfson | |
| 5,175,568 | A * | 12/1992 | Oyamaguchi et al. | 347/113 |
| 5,296,333 | A | 3/1994 | Lamarre | |
| 5,462,700 | A * | 10/1995 | Beeson et al. | 264/1.27 |
| 5,509,554 | A | 4/1996 | Samuelson et al. | |
| 5,685,064 | A * | 11/1997 | Matsuzaki et al. | 29/603.12 |
| 6,211,078 | B1 | 4/2001 | Mathews | |
| 6,251,804 | B1 | 6/2001 | Chen | |
| 6,349,018 | B2 * | 2/2002 | Koishi et al. | 360/236.3 |
| 6,351,345 | B1 * | 2/2002 | Kameyama | 360/236.3 |
| 6,410,424 | B1 * | 6/2002 | Tsai et al. | 438/637 |
| 6,416,935 | B1 * | 7/2002 | Hsiao et al. | 430/320 |
| 6,441,838 | B1 * | 8/2002 | Hindman et al. | 346/63 |
| 6,455,443 | B1 * | 9/2002 | Eckert et al. | 438/781 |
| 6,635,583 | B2 * | 10/2003 | Bencher et al. | 438/761 |
| 6,746,822 | B1 | 6/2004 | Rangarajan et al. | |

(Continued)

FOREIGN PATENT DOCUMENTS

EP 0592972 A2 4/1994

(Continued)

OTHER PUBLICATIONS

Ried, et al., "Air-Bearing Sliders and Plane-Plane-Concave Tips for Atomic Force Microscope Cantilevers", *Journal of Microelectromechanical Systems*, vol. 9, No. 1, Mar. 2000, 52-57.

*Primary Examiner*—Amanda C. Walke

(57) ABSTRACT

Patterning a surface, comprising at least one feature having silicon coupled to a substrate, is described herein. In one embodiment a method is described for patterning a surface which comprises at least one feature having silicon and at least one feature having carbon coupled to a substrate. The surface is coated with 3-(trimethoxysilyl)propyl methacrylate, and a photoresist is applied the 3-(trimethoxysilyl)propyl methacrylate coated surface. The photoresist is imaged and the surface is etched. The photoresist is then removed.

13 Claims, 4 Drawing Sheets

200

232 110 215 213 Slider Body 120 (a)

110 245 213 Slider Body 120 (b)

110 245 234 235 213 Slider Body 120 (c)

110 245 117 243 243 Slider Body 120 (d)

U.S. PATENT DOCUMENTS

| | | | | |
|---|---|---|---|---|
| 6,791,794 | B2 | 9/2004 | Honjo et al. | |
| 7,123,447 | B2 * | 10/2006 | Pendray et al. | 360/234.7 |
| 7,265,161 | B2 * | 9/2007 | Leatherdale et al. | 522/25 |
| 7,554,770 | B2 * | 6/2009 | Tondokoro et al. | 360/235.4 |
| 7,560,225 | B2 * | 7/2009 | Camacho et al. | 430/322 |
| 2005/0112369 | A1 * | 5/2005 | Ibbitson et al. | 428/344 |
| 2005/0126706 | A1 | 6/2005 | Bunch et al. | |
| 2008/0113090 | A1 * | 5/2008 | Lam et al. | 427/123 |

FOREIGN PATENT DOCUMENTS

| | | | |
|---|---|---|---|
| GB | 1262513 | | 2/1972 |
| GB | 2166888 | | 5/1986 |
| JP | 10242028 | | 9/1998 |
| JP | 11119436 | | 4/1999 |
| JP | 2002251015 | | 9/2002 |
| WO | WO 86/00425 | | 1/1986 |
| WO | WO 02/37538 | A2 | 5/2002 |
| WO | WO 02/069046 | | 9/2002 |
| WO | WO 2004/099876 | A1 | 11/2004 |

* cited by examiner

200

(a)

(b)

(c)

(d)

PATTERNING A SURFACE COMPRISING SILICON AND CARBON

TECHNICAL FIELD

This invention relates generally to the field of photolithography and in particular to a method for patterning a surface such as that which is operable as an air bearing surface (ABS) for use in a hard disk drive slider.

BACKGROUND

Photolithography has been a primary tool in the semiconductor industry, and industries that require microscopic features. Photolithography enables microscopic features to be fabricated with precision, varying configurations, and varying purposes. Many products and components fabricated with photolithography require different materials to be imaged and subjected to a gamut of chemical and reactive gas processes. Materials used in the semiconductor and industries requiring microscopic features have variations in surface chemistry that present challenges for the implementation of photolithographic processes.

The hard disk drive (HDD) industry, which provides data storage for the industrial world, uses photolithographic processes in many of its components, e.g. flex cables, integrated lead suspensions, air bearing surfaces, and magnetic transducers. These exemplary components have various materials that require selective etching; i.e. protecting one material while etching another. The material of choice for allowing selective etching is generally known as photoresist. Photoresist is required to adhere simultaneously to various layers of materials; protecting portions of some while allowing portions of others to be etched.

SUMMARY OF THE INVENTION

Various embodiments of the present invention, patterning a surface, comprising at least one feature having silicon coupled to a substrate, are described herein. In one embodiment a method is described for patterning a surface which comprises at least one feature having silicon and at least one feature having carbon coupled to a substrate. The surface is coated with 3-(trimethoxysilyl)propyl methacrylate, and a photoresist is applied the 3-(trimethoxysilyl)propyl methacrylate coated surface. The photoresist is imaged and the surface is etched. The photoresist is then removed.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

DETAILED DESCRIPTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of embodiments of the present invention, numerous specific details are set forth in order to provide a thorough understanding of the present invention. However, it will be recognized by one of ordinary skill in the art that embodiments of the present invention may be practiced without these specific details. In other instances, well known methods, procedures, and components have not been described in detail as not to unnecessarily obscure aspects of the present invention.

The discussion will begin with an overview of an air bearing surface (ABS) for a hard disk drive (HDD) slider to which embodiments of the present invention can be practiced. It will be made clear in this discussion that an ABS for an HDD slider is exemplary of a surface to which this invention is operable, and it will be appreciated that other surfaces requiring the patterning of dissimilar materials can benefit from embodiments of this invention. It is also appreciated that due to the topography of an ABS being very small (measured in tenths of nanometers) and comprising layers, a layer when etched and portions of the layer are exposed to comprise the ABS, an etched and exposed layer is referred to as a surface. The discussion will then focus on embodiments of the present invention that enable the fabrication of an ABS. The implementation of embodiments of the present invention will then be discussed.

Overview

Figure 1:
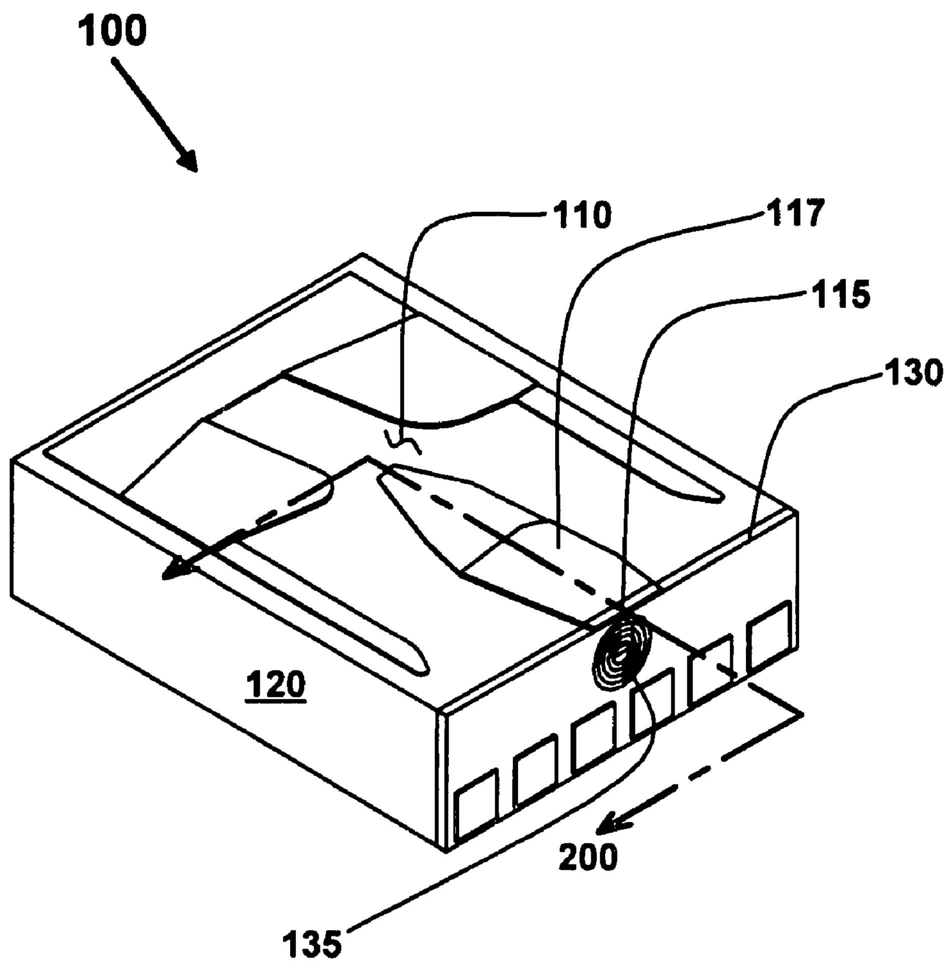
FIG. 1 is an isometric of a hard disk drive slider upon which embodiments of the present invention can be practiced.

With reference to FIG. 1, an isometric of HDD slider 100 is presented upon which embodiments of the present invention can be practiced. Early in the evolution of slider 100 with deposited magnetic transducer 135 and patterned air bearing surface 110, the composition of the ABS was nearly uniform. ABS 110 consisted of the slider body 120, a small section of deposition 130, and a smaller section of exposed magnetic transducer 135 known as the pole tips 115. Slider body 120 consisted of a matrix of titanium-carbonate and aluminum oxide ($TiC—Al_2O_3$). Pole tips 115 then as well as now were encased in a deposition 130, comprising $Al_2O_3$. The chemistry of the surface that was to become the ABS was dominated by the surface chemistry of $Al_2O_3$.

The surface chemistry of a surface can be defined as the characteristic of a surface to have chemical reactions occur at the interface of the surface and another material. Surface chemistry is important to achieving good adhesion between surfaces. An example of good surface chemistry for the purpose of good adhesion is the surface chemistry between aluminum and epoxy. An example of poor surface chemistry for the purpose of good adhesion is polytetrafluoroethylene (PTFE or Teflon™) and epoxy. Consistent surface chemistry facilitates adhering photoresist to the slider body during the photolithographic process for defining the ABS.

The ABS for a hard disk drive slider has evolved into ABS 110 which comprises features with compositions that vary from the TiC—$Al_2O_3$ matrix of slider body 120, the predominant $Al_2O_3$ deposition 130, and pole tips 115. These features are known as pro-pads 117 (protruding pads) and have been incorporated into various ABS designs for the performance and design advantages they offer. A pro-pad is characterized by the addition of material to the ABS, which is coupled to and becomes part of the ABS. The materials chosen to make a pro-pad, are varied and are determined by performance requirements placed upon a particular ABS design. Examples of pro-pad material are silicon nitride and/or carbon.

As with ABS 110, other technologies requiring the fabrication of microscopic feature, such as the semiconductor and MEMS technologies, in many instances require patterning a surface comprising features with different composition and chemistry. For example, carbon is being designed into more semiconductor devices as an insulating layer and as a conductor in the form of nanotubes. MEMS structures are mostly fabricated using silicon substrate. Carbon, both amorphous and diamond like is finding more benefits in MEMS devices, in part due to carbon's wear characteristics.

Physical Description

With continued reference to FIG. 1, the evolution of ABS 110 has been driven by performance requirements such as durability, constant fly height under varying flying conditions, and manufacturability (cost performance). In striving to achieve these performance requirements, novel features have been incorporated into ABS 110. Of late the development of the pro-pad has provided ABS designers with another tool to meet ABS performance requirements. Pro-pad 117 is exemplary of any number of pro-pads that comprises ABS 110.

Figure 2:
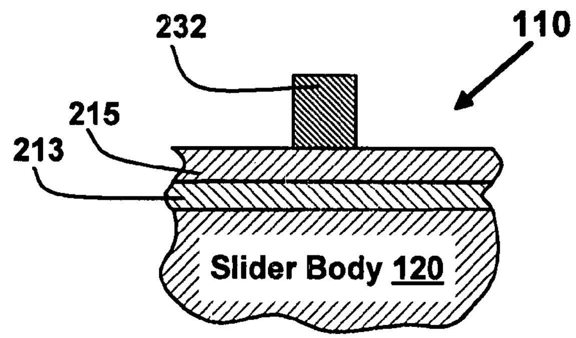
FIGS. 2A through 2D are cross-sections of a detail of a hard disk drive slider at process components of fabrication in accordance with one embodiment of the present invention.
Figure 2:
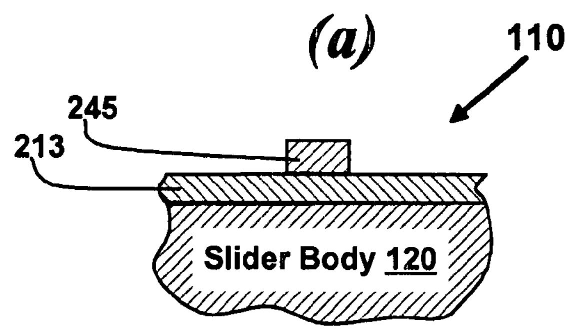
Figure 2:
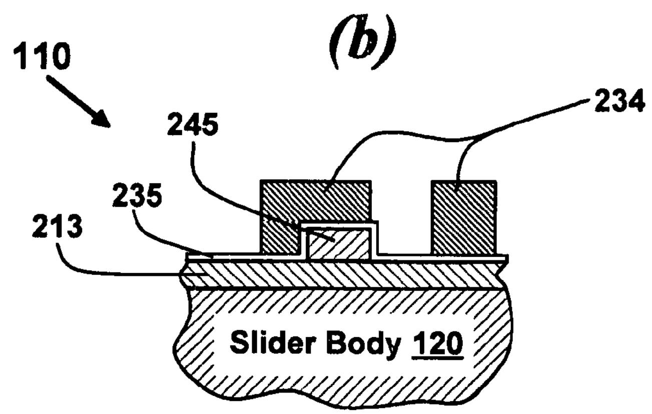
Figure 2:
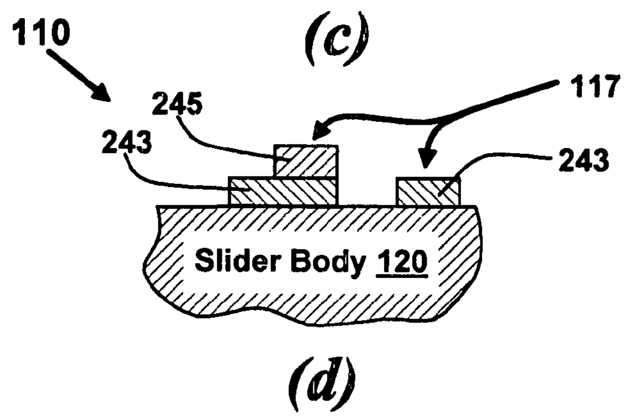

FIG. 2D is cross-section 200 of pro-pad 117 and exemplifies a typical pro-pad of ABS 110. Pro-pad 117 comprises silicon layer 213, which comprises silicon such as approximately stoichiometric silicon nitride, $Si_3N_4$, and/or carbon layer 215, such as Filtered Cathodic Arc Carbon (FCAC) and Diamond-Like Carbon (DLC). Pro-pad 117 is coupled to slider body 120 via the deposition processes associated with the application of silicon layer 213 and carbon layer 215. In accordance with an embodiment of the present invention pro-pad 117 comprises: a combination of silicon layer 213 and carbon layer 215; primarily silicon layer 213; and primarily carbon layer 215.

The introduction of pro-pad to the ABS has presented some challenges for fabricating an ABS with pro-pads. One of these challenges is in the patterning of the pro-pad coupled to the ABS. Patterning the ABS and its incorporated pro-pads is preceded by a process of transferring the image of an ABS design to slider body 120. This process is well known in the art as photolithography. It is advantageous to apply the photolithographic process to a surface that comprises one layer or features made from layers with similar surface chemistry. Well known and understood in the art is a component of the photolithography process known as photoresist. In general, photoresist is a light sensitive material that, depending on formulation, either becomes soluble in a solvent, or becomes resistant to dissolution in a solvent. An ABS image is first produced in a photo tool known as a mask, and light is transmitted through the mask to transfer the ABS image onto the slider body, which was previously coated with photoresist.

When adhesion is poor between the slider body and photoresist, an adhesion promoter is applied to the substrate prior to the application of photoresist. An adhesion promoter is typically applied to the substrate, in the present example a slider body, prior to the application of photoresist. Depending upon the materials to which photoresist is to be applied, an adhesion promoter is chosen for its reaction to the surface chemistry of the substrate as well as that of the photoresist. Some adhesion promoters may also enhance adhesion by removing absorbed water from the substrate material, thereby reducing surface energy. With today's ABS configurations comprising complex surfaces, such as pro-pads, the challenge is to find an adhesion promoter that can promote the adhesion between photoresist and the various materials such as silicon and carbon that are used in some pro-pads. As presented in FIG. 2C and in accordance with an embodiment of the present invention, adhesion promoter 235, comprising 3-(trimethoxysilyl)propyl methacrylate, is applied simultaneously to carbon feature 245, and to silicon layer 213. Adhesion promoter 235, comprising 3-(trimethoxysilyl)propyl methacrylate enables the adhesion of photoresist 234 to silicon layer 213 and to carbon feature 245.

Operation

Figure 3:
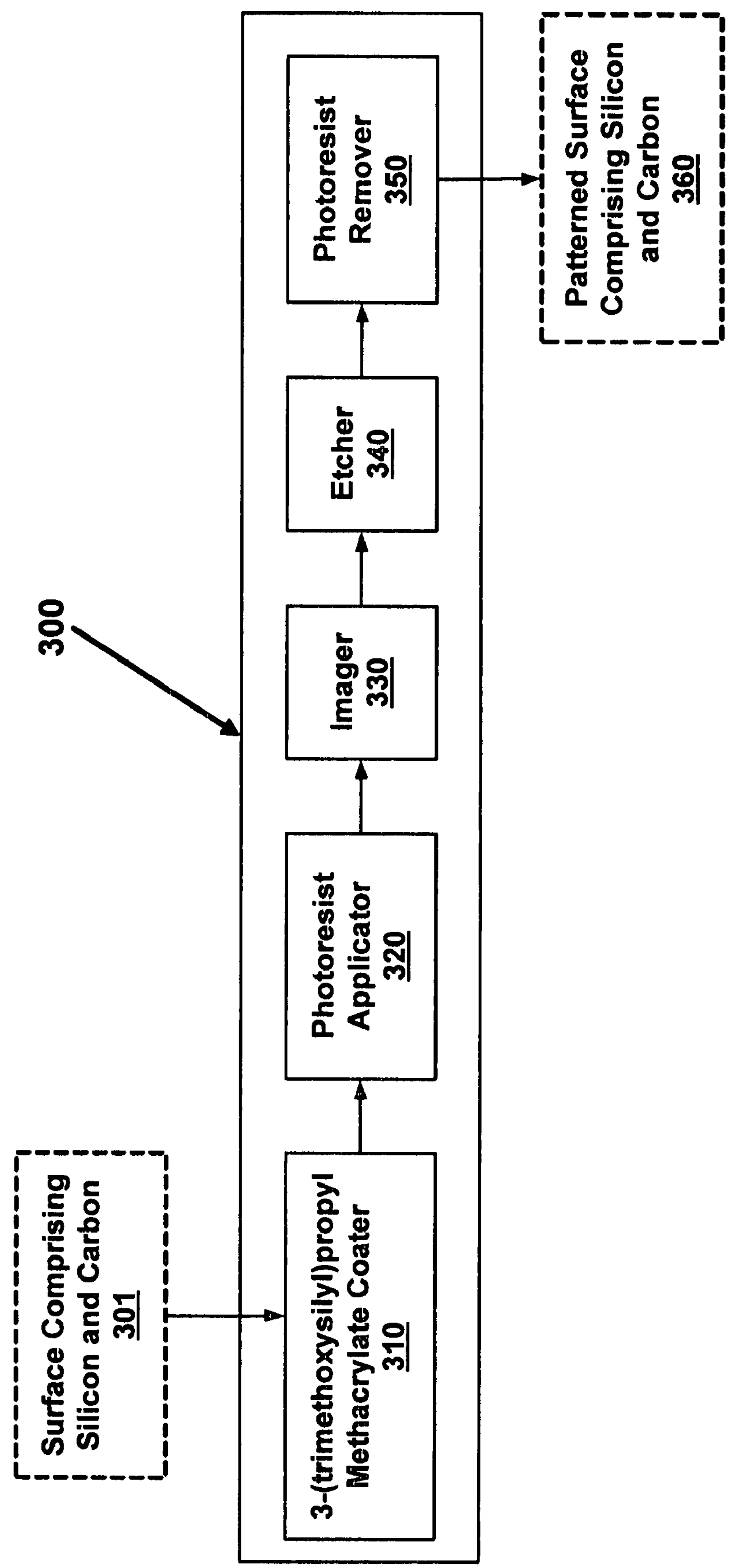
FIG. 3 is a block diagram of a system for patterning a surface in accordance with one embodiment of the present invention.

FIG. 3 is a block diagram illustrating system 300 for patterning a surface in accordance with one embodiment of the present invention. System 300 includes 3-(trimethoxysilyl) propyl methacrylate coater 310, photoresist applicator 320, imager 330, etcher 340, and photoresist remover 350. It should be appreciated that system 300 can be implemented by software, hardware, firmware, or any combination thereof. Moreover, it should be appreciated that system 300 may include additional components that are not shown so as to not unnecessarily obscure aspects of the embodiments of the present invention.

System 300 is operable to coating a surface comprising at least one feature having silicon and at least one feature having carbon, wherein the silicon and carbon features are coupled to a substrate. With reference to FIG. 2D and in accordance with an embodiment of the present invention, wherein application of embodiments of the present invention are to an ABS, silicon feature 243 couples carbon feature 245 to slider body 120. Pro-pad 117 comprises silicon feature 243 having silicon layer 213, and carbon feature 245 having carbon layer 215.

In accordance with an embodiment of the present invention, silicon layer 213 comprises approximately stoichiometric silicon nitride $Si_3N_4$. In accordance with another embodiment of the present invention carbon layer 215 comprises wear-resistant carbon, such as Filtered Cathodic Arc Carbon (FCAC) and Diamond-Like Carbon (DLC).

Coater 310 for applying 3-(trimethoxysilyl)propyl methacrylate of system 300 to a substrate includes but is not limited to coater means such as, dip coating, flooding, flooding and spinning, spray coating, doctor blading, screen printing, tampon printing, and pad printing. In general, coater 310 provides means to apply a controlled and approximately constant thickness of 3-(trimethoxysilyl)propyl methacrylate to surface 301 comprising silicon and carbon.

Photoresist applicator 320 of system 300 includes but is not limited to coater means such as, dip coating, flooding, flooding and spinning, spray coating, doctor blading, screen printing, tampon printing, pad printing, and dry film lamination. In general, photoresist applicator 320 provides means to apply a controlled and approximately constant thickness of liquid and/or dry film photoresist to the 3-(trimethoxysilyl)propyl methacrylate coated surface.

Imager 330 of system 300 includes but is not limited to imager means such as exposure to light through a contact mask, and a projection mask, exposure to a controlled and focused light beam and electron beam. Following exposure and part of imager 330, is a developer means such as sodium hydroxide and tetramethylammonium hydroxide. In general imager 330 provides means to transfer an image, such as an image of a pro-pad, into a layer of photoresist and removing photoresist to reveal a pattern, such as a pattern of a pro-pad.

Etcher 340 of system 300 includes but is not limited to etcher means such as wet etching in a chemical solution, which is reactive to surface 301, and dry etching in a vacuum chamber containing plasma and gas reactive to surface 301. In general etcher 340 provides means to etch surface 301 comprising silicon and carbon, in accordance to the image formed by imager 330.

Photoresist remover 350 of system 300 includes but is not limited to photoresist remover means such as solvent removal systems, such as N-methylpyrrolidone (NMP) and acetone, and dry removal systems, such as sputter etching and plasma etching.

In accordance with an embodiment of the present invention, the implementation of system 300 results in patterned surface comprising silicon and carbon 360.

It is appreciated by those skilled in the art that many smaller system modules, such as those associated with cleaning, drying, baking and the like have not been described herein or presented in system 300 for the sake of brevity and clarity.

Figure 4:
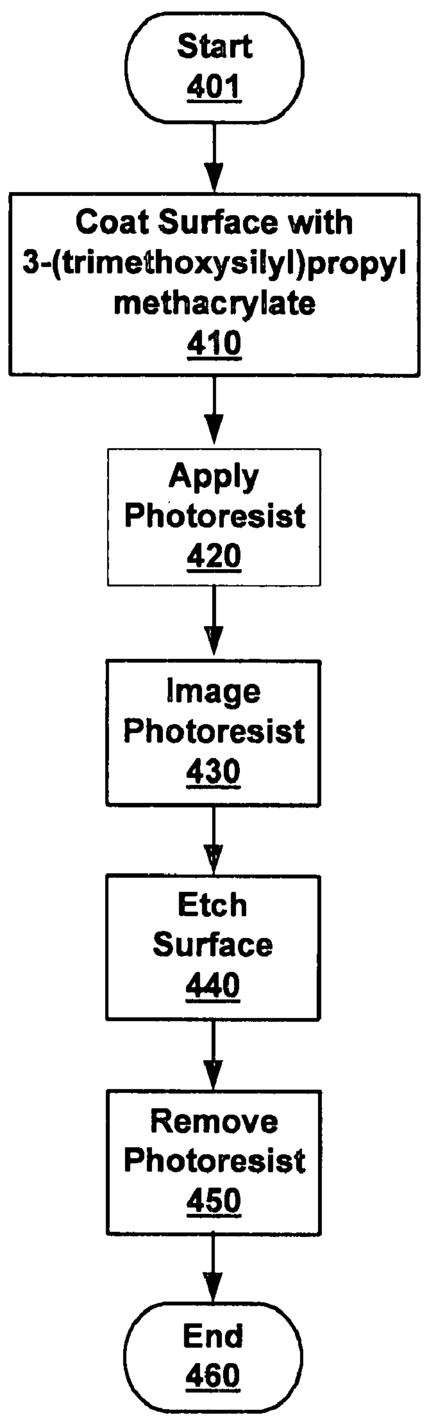
FIG. 4 is a flow chart illustrating a process for patterning a surface in accordance with one embodiment of the present invention.

FIG. 4 is a flow chart illustrating process 400 for patterning a surface in accordance with an embodiment of the present invention. In one embodiment, process 400 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. Although specific components are disclosed in process 400, such components are exemplary. That is, the embodiments of the present invention are well suited to performing various other components or variations of the components recited in FIG. 4. Within the present embodiment, it should be appreciated that the components of process 400 may be performed by software, by hardware, by an assembly mechanism, through human interaction, or by any combination of software, hardware, assembly mechanism, and human interaction.

Process 400 will be described with reference to elements shown in FIG. 2A through FIG. 2D.

In one embodiment, as shown at 401 of process 400, a surface is introduced into process 400. A surface that is suitable for process 400 is a surface comprising at least one feature having silicone and at least one feature having carbon, coupled to a substrate. With reference to FIG. 2A, and in accordance with an embodiment of the present invention, silicon layer 213 comprises approximately stoichiometric silicon nitride $Si_3N_4$. In accordance with another embodiment of the present invention carbon layer 215 comprises wear-resistant carbon, such as Filtered Cathodic Arc Carbon (FCAC) and Diamond-Like Carbon (DLC). It is appreciated that a layer is a feature when the boundaries of a layer are considered.

With reference to FIG. 2A, a photolithography process comprising photoresist image 232 is used to fabricate carbon feature 245 from carbon layer 215. Since carbon layer 215 is the predominant layer to which photoresist image 232 must adhere, an adhesion promoter is not necessary for adhering photoresist image 232 to carbon layer 215. With reference to FIG. 2B, and in accordance with an embodiment of the present invention, a suitable surface is air bearing surface (ABS) 110 coupled to slider body 120. ABS 110 comprises at least one feature having silicone layer 213 and at least one feature having carbon layer 215, coupled to a slider body 120. With reference to FIG. 2D and in accordance with an embodiment of the present invention, wherein embodiments of the present invention are applied to an ABS, silicon feature 243 couples carbon feature 245 to slider body 120.

In one embodiment, as shown at 410 of process 400, surface 110 is coated with adhesion promoter 235 comprising 3-(trimethoxysilyl)propyl methacrylate. With reference to FIG. 2C, adhesion promoter 235 comprising 3-(trimethoxysilyl)propyl methacrylate is applied to surface 110 comprising silicon layer 213 and carbon feature 245. In so doing, subsequent photoresist 234 is enabled to adhere simultaneously to silicon layer 213 and carbon feature 245.

In one embodiment, as shown at 420 of process 400, photoresist is applied to surface 110 coated with adhesion promoter 235 comprising 3-(trimethoxysilyl)propyl methacrylate. With reference to FIG. 2C, photoresist 234 is applied to ABS 110 which has been coated with adhesion promoter 235 comprising 3-(trimethoxysilyl)propyl methacrylate. In one embodiment of the present invention, photoresist 234 is a liquid resist applied by any one of several known techniques such as, dip coating, flooding, flooding and spinning, spray coating, doctor blading, screen printing, tampon printing, and pad printing. In accordance with another embodiment of the present invention, photoresist 234 is a dry film resist applied by dry film lamination. Adhesion of photoresist 234 simultaneously to dissimilar materials such as carbon feature 245 and silicon layer 213 is difficult due to the difference in surface chemistry. Coating carbon feature 245 and silicon layer 213 with adhesion promoter 235 comprising 3-(trimethoxysilyl) propyl methacrylate, enables photoresist 234 to adhere to ABS 110.

In one embodiment, as shown at 430 of process 400, photoresist is imaged. With reference to FIG. 2C, photoresist 234 is imaged according to a predefined pattern for pro-pads 117 (FIG. 2D). The imaging process for photoresist 234 is typically known as photolithography. It is appreciated that there are many detailed parts to photolithography, which for the sake of brevity and clarity have been left unmentioned, but are understood as common practice in the art of photolithography. In general, the intent of image photoresist 430 is to transfer an image, such as an image of pro-pad 117, into a layer of photoresist and removing photoresist to reveal a pattern, such as a pattern of pro-pad 117 in photoresist 234.

In one embodiment, as shown at 440 of process 400, the surface of layer 213 is etched. With reference to FIG. 2D, silicon layer 213 is etched to form silicon feature 243. Usually the etchant used to etch silicon feature 243 from silicon layer 213 is an etchant that does not react aggressively with carbon layer 215. This is usually true for wet chemical etchants. Dry etchants, such as a plasma or reactive ion etch, are very directional and have minimal effect on carbon feature 245.

In one embodiment, as shown at 450 of process 400, photoresist 234 is removed from ABS 110. With reference to FIG. 2D, upon removal of photoresist 234 from ABS 110, pro-pad 117 is ready for further processing through the ABS fabrication process. Removal of photoresist 234 may be accomplished by several methods well known to those of ordinary skill in the art. Some examples of removal methods are: removal by solvents such as N-methylpyrrolidone (NMP) and acetone, and dry etching in partial vacuum, such as sputter etching and plasma etching.

In one embodiment, as shown at 460 of process 400, a method of patterning surface, wherein surface comprises at least one feature having silicon and at least one feature having carbon coupled to a substrate is complete. In accordance with an embodiment of the present invention, the surface is air bearing surface 110, and the substrate is slider body 120.

The present invention, in the various presented embodiments allows for patterning a surface, wherein the surface comprises at least one feature having silicon and at least one feature having carbon coupled to a substrate. One of ordinary skill in the art will appreciate that embodiments of the present invention are a benefit to any surface requiring patterning, wherein the surface comprises at least one feature having silicon and at least one feature having carbon coupled to a substrate, such as an ABS of a HDD slider.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of patterning a surface, wherein said surface comprises at least one feature comprising silicon coupled to a substrate, comprising:

coating said surface with 3-(trimethoxysilyl)propyl methacrylate;

applying a photoresist to said 3-(trimethoxysilyl)propyl methacrylate coated surface;

imaging said photoresist;

etching said surface; and removing said photoresist.

2. The method of patterning a surface of claim 1 further comprising at least one feature comprising carbon.

3. The method of patterning a surface of claim 1 wherein said at least one feature of silicon comprises approximately stoichiometric silicon nitride.

4. The method of patterning a surface of claim 1 wherein said photoresist comprises a liquid.

5. The method of patterning a surface of claim 1 wherein said photoresist comprises a dry film.

6. The method of patterning a surface of claim 2 wherein said at least one feature of silicon couples said at least one feature of carbon to said substrate.

7. The method of patterning a surface of claim 2 wherein said at least one feature comprising carbon comprises wear-resistant carbon.

8. A method of patterning an air bearing surface, wherein said air bearing surface comprises at least one feature having silicon and at least one feature having carbon coupled to a slider, comprising:

coating said air bearing surface with 3-(trimethoxysilyl) propyl methacrylate;

applying a photoresist to said 3-(trimethoxysilyl)propyl methacrylate coated air bearing surface;

imaging said photoresist;

etching said air bearing surface; and removing said photoresist.

9. The method of patterning a surface of claim 8 wherein said feature of silicon couples said feature of carbon to said slider.

10. The method of patterning a surface of claim 8 wherein said feature of silicon comprises approximately stoichiometric silicon nitride.

11. The method of patterning a surface of claim 8 wherein said feature of carbon comprises wear-resistant carbon.

12. The method of patterning a surface of claim 8 wherein said photoresist comprises a liquid.

13. The method of patterning a surface of claim 8 wherein said photoresist comprises a dry film.

* * * * *